(12) United States Patent
Zhang

(10) Patent No.: US 12,185,505 B2
(45) Date of Patent: Dec. 31, 2024

(54) SCENARIO TEMPERATURE PLANNING METHOD AND DEVICE, AND STORAGE MEDIUM

(71) Applicant: ARIZE CORPORATION, Anaheim, CA (US)

(72) Inventor: Yangguang Zhang, Shenzhen (CN)

(*) Notice: Subject to any disclaimer, the term of this patent is extended or adjusted under 35 U.S.C. 154(b) by 77 days.

(21) Appl. No.: 17/819,229

(22) Filed: Aug. 11, 2022

(65) Prior Publication Data

US 2023/0045944 A1 Feb. 16, 2023

(30) Foreign Application Priority Data

Aug. 12, 2021 (CN) .......................... 202110924661.3

(51) Int. Cl.
*G06F 1/20* (2006.01)
*H05K 7/20* (2006.01)

(52) U.S. Cl.
CPC ......... *H05K 7/20836* (2013.01); *G06F 1/206* (2013.01)

(58) Field of Classification Search
CPC ....................................................... G06F 1/206
See application file for complete search history.

(56) References Cited

U.S. PATENT DOCUMENTS

| | | | |
|---|---|---|---|
| 2013/0289795 A1* | 10/2013 | Aldinger ................ | G05D 23/19 |
| | | | 700/300 |
| 2016/0361515 A1* | 12/2016 | Jung ................. | A61B 5/02055 |
| 2023/0189470 A1* | 6/2023 | Bang ....................... | G06F 1/206 |
| | | | 700/300 |

FOREIGN PATENT DOCUMENTS

| | | | | |
|---|---|---|---|---|
| CN | 208207597 U | * | 12/2018 | |
| CN | 109654682 A | * | 4/2019 | ............. F24F 11/52 |
| CN | 111023494 A | * | 4/2020 | ............. F24F 11/61 |
| CN | 111309144 A | * | 6/2020 | ............. G06F 3/013 |
| CN | 113035234 A | * | 6/2021 | |
| EP | 2657803 A1 | * | 10/2013 | ............. G05D 23/19 |
| JP | 5951149 B1 | * | 7/2016 | ............. F24F 11/02 |

* cited by examiner

*Primary Examiner* — Suresh Suryawanshi
(74) *Attorney, Agent, or Firm* — Tsz Lung Yeung

(57) ABSTRACT

The present application provides a scenario temperature planning method and apparatus, a computer device, and a medium, where the scenario temperature planning method includes: obtaining original data in a current temperature planning cycle in a target scenario, where the original data is data generated based on a user's temperature adjustment operation; performing data merging and data elimination processing on the original data to obtain valid data; and adjusting temperature planning data of the current temperature planning cycle based on the valid data to obtain temperature planning data of a next temperature planning cycle of the current temperature planning cycle, so as to adjust a temperature in a target scenario in the next temperature planning cycle. The technical solution enables the adjusted temperature to meet the user's temperature requirements without requiring the user to manually plan and set the temperature, thereby improving user experience.

7 Claims, 8 Drawing Sheets

SCENARIO TEMPERATURE PLANNING METHOD AND DEVICE, AND STORAGE MEDIUM

CROSS-REFERENCE TO RELATED APPLICATIONS

This application claims priority to Chinese Patent Application CN202110924661.3, filed with the China National Intellectual Property Administration on Aug. 12, 2021 and entitled "SCENARIO TEMPERATURE PLANNING METHOD AND DEVICE, AND STORAGE DEVICE", which is incorporated herein by reference in its entirety.

TECHNICAL FIELD

The present application relates to the field of data planning, and in particular, to a scenario temperature planning method and apparatus, a computer device, and a medium.

BACKGROUND

Data planning is a method that is involved in various application scenarios at present. Operation data in these application scenarios is enabled to be more reasonable through the data planning. Temperature data planning refers to planning and control over temperature operation data in a scenario, so that the temperature operation data in the scenario meets a user requirement in the scenario, so as to achieve intelligent temperature control in the scenario.

At present, an intelligent temperature control solution requires a user to plan and set a temperature based on a temperature requirement in advance. When the user's temperature requirement changes, the user is required to manually re-plan and set the temperature, which is cumbersome in operation and leads to poor user experience.

SUMMARY

The present application provides a scenario temperature planning method and apparatus, a computer device, and a medium, to solve the technical problems of cumbersomeness in operation and poor user experience in a temperature control solution.

According to a first aspect, a scenario temperature planning method is provided, and the method includes the following steps:

obtaining original data in a current temperature planning cycle in a target scenario, where the foregoing original data is data generated based on a user's temperature adjustment operation, and the foregoing original data includes a temperature adjustment time and a temperature value;

performing data merging and data elimination processing on the foregoing original data to obtain valid data, where temperature duration corresponding to the foregoing valid data is greater than first preset duration, temperature duration corresponding to any data refers to a time length of a temperature keeping time period corresponding to the foregoing any data, the foregoing temperature keeping time period uses the temperature adjustment time of the foregoing any data as a start time and uses a next temperature adjustment time corresponding to the foregoing any data as an end time, and the foregoing next temperature adjustment time refers to a latest temperature adjustment time after the temperature adjustment time of the foregoing any data; and adjusting temperature planning data of the foregoing current temperature planning cycle based on the foregoing valid data to obtain temperature planning data of a next temperature planning cycle of the foregoing current temperature planning cycle, so as to adjust a temperature in a target scenario in the foregoing next temperature planning cycle.

In this technical solution, the original data generated based on the user's temperature adjustment operation in the current temperature planning cycle in the target scenario is obtained first, so that data that can reflect the user's real temperature requirement can be obtained; then data merging and data elimination processing is performed on the original data, so that the valid data that can reflect the user's real temperature requirement and is reasonable and effective can be obtained; finally, the temperature planning data of the current temperature planning cycle is adjusted based on the valid data to obtain the temperature planning data of the next temperature planning cycle of the current temperature planning cycle, so that the temperature planning data may be reasonably and match the user's temperature requirement, and therefore in the next temperature planning cycle, when the temperature in the target scenario is adjusted based on the temperature planning data of the next temperature planning cycle, the adjusted temperature can meet the user's temperature requirement without requiring the user to manually plan and set the temperature, thereby improving user experience.

In conjunction with the first aspect, in a possible implementation, the foregoing performing data merging and data elimination processing on the foregoing original data includes: if it is determined that duration between a temperature adjustment time of first original data and a temperature adjustment time of second original data is less than second preset duration, and temperature adjustment values corresponding to the foregoing first original data and the foregoing second original data are both less than a first preset value, merging the foregoing first original data and the foregoing second original data, where the foregoing first original data is any original data, the foregoing second original data is next original data of the foregoing first original data, and the foregoing temperature adjustment values each refer to a difference between a temperature value before a temperature adjustment and a temperature value after the temperature adjustment; and eliminating third original data from the merged original data, where temperature duration corresponding to the foregoing third original data is less than or equal to the foregoing first preset duration. By merging original data with a shorter adjustment time interval and a smaller adjustment range, and deleting original data with a shorter temperature duration, some invalid temperature adjustment data can be filtered out, which can make the temperature adjustment data more reasonable.

In conjunction with the first aspect, in a possible implementation, the foregoing merging the foregoing first original data and the foregoing second original data includes: using the temperature adjustment time of the foregoing first original data as a temperature adjustment time of the merged original data, using a temperature value of the foregoing second original data as a temperature value of the foregoing merged original data, and using a sum of temperature duration corresponding to the foregoing first original data and the foregoing second original data as temperature duration corresponding to the merged original data. The temperature adjustment time of the former piece of original data is used as the temperature adjustment time of the merged original data, and the temperature value of the latter piece of original data is used as the temperature value of the merged original data, so that the original data with a shorter time interval can be merged, so as to make the temperature adjustment data more reasonable.

In conjunction with the first aspect, in a possible implementation, the foregoing merging the foregoing first original data and the foregoing second original data includes: if the sum of the temperature duration corresponding to the foregoing first original data and the temperature duration corresponding to the foregoing second original data is less than third preset duration, merging the foregoing first original data and the foregoing second original data, where the foregoing third preset duration is greater than the foregoing second preset duration. The two pieces of original data are merged only when the sum of the temperature duration of the former and latter pieces of original data is not greater than the third preset duration, which can prevent a situation that the temperature adjustment data does not change for a long time, ensuring data rationality.

In conjunction with the first aspect, in a possible implementation, the foregoing adjusting temperature planning data of the foregoing current temperature planning cycle based on the foregoing valid data to obtain temperature planning data of a next temperature planning cycle of the foregoing current temperature planning cycle includes: determining a temperature adjustment time, a temperature value and temperature duration corresponding to the foregoing valid data; and adjusting, in the temperature planning data of the foregoing current temperature planning cycle, a temperature value of a target time period to the temperature value corresponding to the foregoing valid data to obtain temperature planning data of the foregoing target time period, where the foregoing target time period uses the temperature adjustment time corresponding to the foregoing valid data as a start time, and uses the temperature duration corresponding to the foregoing valid data as duration. In the temperature planning cycle, the temperature value of the time period corresponding to the valid data is adjusted to the temperature value corresponding to the valid data, to obtain the temperature planning data of the target time period, so that the temperature planning data in the temperature planning cycle matches the user's temperature requirement.

In conjunction with the first aspect, in a possible implementation, after the foregoing adjusting, in the foregoing current temperature planning cycle, a temperature value of a target time period to the temperature value corresponding to the foregoing valid data, the method further includes: based on the temperature adjustment time and the temperature duration corresponding to the foregoing target time period, in the temperature planning data of the foregoing current temperature planning cycle, advancing the start time of the foregoing target time period, and/or delaying an end time of the foregoing target time period, so that the temperature planning data of the adjusted target time period conforms to a preset granularity rule, where the preset granularity rule refers to adjusting a temperature at a preset temperature adjustment moment; and in the temperature planning data of the adjusted current temperature planning cycle, merging temperature planning data of a first time period and temperature planning data of a second time period, where the foregoing first time period and the foregoing second time period are two adjacent time periods with different temperature planning data, and the foregoing second time period is a next time period of the foregoing first time period; where a temperature difference between the temperature planning data of the foregoing first time period and the temperature planning data of the second time period is less than a second preset value, and/or duration of the foregoing second time period is less than fourth preset duration, and the foregoing temperature adjustment value refers to a difference between a temperature value before a temperature adjustment and a temperature value after the temperature adjustment. After the temperature planning data is obtained based on the valid data, the adjusted temperature planning data is enabled to be more regular by advancing and/or delaying the time of the time period corresponding to the valid data, and temperature planning data with shorter duration is merged with the former piece of temperature planning data or temperature planning data with a smaller temperature difference, so that the rationality of the temperature planning data can be ensured, and invalid temperature planning data can be avoided.

In conjunction with the first aspect, in a possible implementation, the foregoing method further includes:
if two pieces of original data with temperature adjustment values less than a third preset value are obtained in the same time period of two consecutive temperature planning cycles, adjusting temperature planning data of each temperature planning cycle based on the two pieces of original data with the foregoing temperature adjustment values less than the third preset value, where the foregoing temperature adjustment value each refer to a difference between a temperature value before a temperature adjustment and a temperature value after the temperature adjustment. If temperature adjustment values obtained in the same time period in two temperature planning cycles are close, it indicates a normal temperature adjustment operation, reflecting the user's temperature requirement. The temperature planning data of each temperature planning cycle is adjusted, so that the temperature planning data can meet the user's requirement.

In conjunction with the first aspect, in a possible implementation, a plurality of temperature planning cycles constitute a scenario planning cycle, and the foregoing scenario planning cycle is obtained based on cycle characteristics in the foregoing target scenario; and the foregoing method further includes: if two pieces of original data with temperature adjustment values less than a fourth preset value are obtained in the same time period of a first temperature planning cycle and a second temperature planning cycle, adjusting, based on the two pieces of original data with the foregoing temperature adjustment values less than the fourth preset value, temperature planning data of a temperature planning cycle corresponding to the foregoing first temperature planning cycle in each scenario planning cycle, where the foregoing first temperature planning cycle and the foregoing second temperature planning cycle are separately the same temperature planning cycle in two adjacent scenario planning cycles. If temperature adjustment values obtained in the same time period in two temperature planning cycles are closer, it indicates a normal temperature adjustment operation, reflecting the user's temperature requirement. The temperature planning data of each scenario planning cycle is adjusted, so that the temperature planning data can meet the user's requirement.

According to a second aspect, a scenario temperature planning apparatus is provided, including:
an obtaining module, configured to obtain original data in a current temperature planning cycle in a target scenario, where the foregoing original data is data generated based on a user's temperature adjustment operation, and the foregoing original data includes a temperature adjustment time and a temperature value;

a data processing module, configured to is perform data merging and data elimination processing on the foregoing original data to obtain valid data, where temperature duration corresponding to the foregoing valid data is greater than first preset duration, temperature duration corresponding to any data refers to a time length of a temperature keeping time period corresponding to the foregoing any data, the foregoing temperature keeping time period uses the temperature adjustment time of the foregoing any data as a start time and uses a next temperature adjustment time corresponding to the foregoing any data as an end time, and the foregoing next temperature adjustment time refers to a latest temperature adjustment time after the temperature adjustment time of the foregoing any data; and an adjustment module, configured to adjust temperature planning data of the foregoing current temperature planning cycle based on the foregoing valid data to obtain temperature planning data of a next temperature planning cycle of the foregoing current temperature planning cycle, so as to adjust a temperature in a target scenario in the foregoing next temperature planning cycle.

According to a third aspect, a computer device is provided, including a memory and one or more processors, where the one or more processors are configured to execute one or more computer programs stored in the memory, and when the one or more processors execute the one or more computer programs, the computer device is enabled to implement the scenario temperature planning method according to the first aspect.

According to a fourth aspect, a computer-readable storage medium is provided, where the computer-readable storage medium stores a computer program, the computer program includes program instructions, and when the foregoing program instructions are executed by a processor, the foregoing processor is enabled to perform the scenario temperature planning method according to the first aspect.

The present application may have the following beneficial effects: Temperature planning data in a current planning cycle is adjusted based on original data in the current planning cycle to obtain temperature planning data for adjusting a temperature in a next temperature planning cycle of the current planning cycle, so that the adjusted temperature can meet a user's temperature requirement without requiring the user to manually plan and set the temperature, thereby improving user experience.

DESCRIPTION OF EMBODIMENTS

Technical solutions in embodiments of the present application are described below in conjunction with the accompanying drawings in the embodiments of the present application.

The technical solutions of the present application can be applied to various scenarios requiring temperature planning and adjustment, such as an office scenario, a family scenario, a hospital scenario, and a machine room scenario. In different scenarios, temperature requirements are different. If a temperature adjustment and setting operation is always performed by a manager in each scenario, it will result in waste of human resources, which is not conducive to improving efficiency. Therefore, the present application provides a scenario temperature planning method, which continuously adjusts temperature planning data in a scenario by obtaining and learning a temperature adjustment situation in this scenario, so that the temperature planning data can meet a user's temperature requirements in this scenario, that is, temperature data obtained by adjusting the temperature in this scenario based on the temperature planning data can meet the user's temperature requirement in this scenario, thereby omitting the user's operation of adjusting and setting the temperature and improving user experience.

Figure 1:
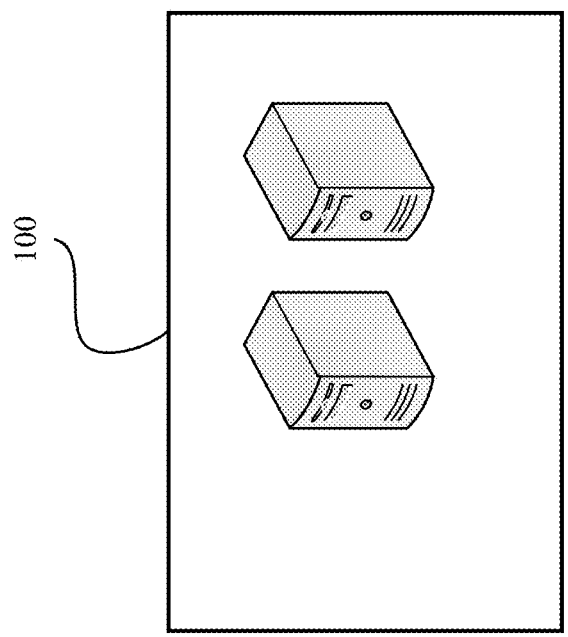
FIG. 1 is a schematic diagram of a system architecture of a temperature planning system provided in an embodiment of the present application.
Figure 1:
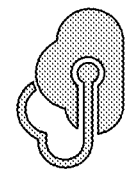
Figure 1:
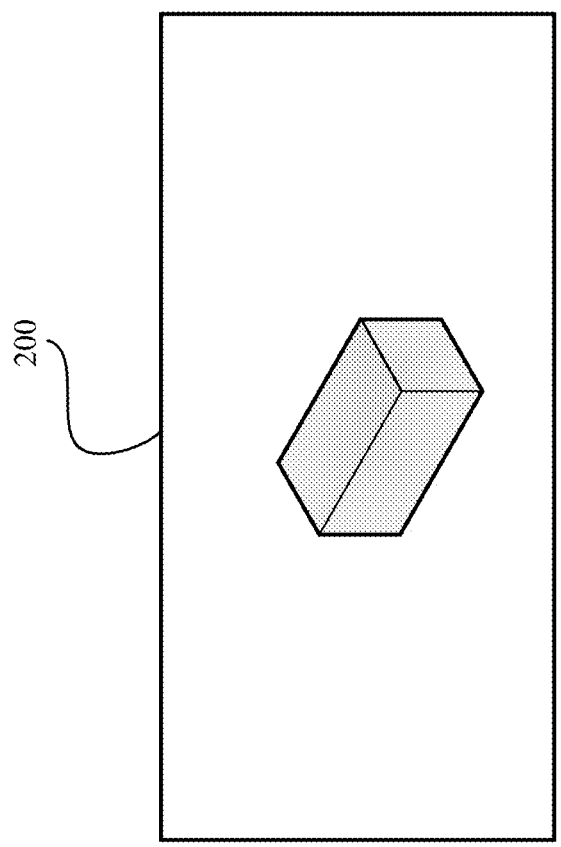

In some possible embodiments, the scenario temperature planning method according to the present application can be implemented in a temperature planning system composed of a cloud device and a local temperature adjustment device. As shown in FIG. 1, the temperature planning system includes two parts: a cloud device 100 and a temperature adjustment device 200, where the cloud device 100 and the local temperature adjustment device 200 communicate with each other over the Internet. The temperature adjustment device 200 is configured to obtain and respond to the user's temperature adjustment operation and upload temperature adjustment data related to the temperature adjustment operation to the cloud device 100; and receive the temperature planning data sent by the cloud device 100, and adjust and set the temperature based on the temperature planning data. The cloud device 100 is configured to receive the temperature adjustment data uploaded by the temperature adjustment device 200, determine the temperature planning data matching the user's temperature adjustment operation based on the temperature adjustment data, and send the temperature planning data to the temperature adjustment device 200 of a temperature device. Specifically, the temperature adjustment device 200 may be a temperature controller or other temperature adjustable devices; and the cloud device 100 may be a cloud server.

Optionally, the scenario temperature planning method according to the present application may alternatively be directly implemented on the foregoing temperature adjustment device 200, and no limitation is imposed on this the present application.

The technical solution of the present application may be implemented based on the foregoing temperature planning system or the foregoing temperature device, and the technical solution of the present application is specifically described below.

Figure 2:
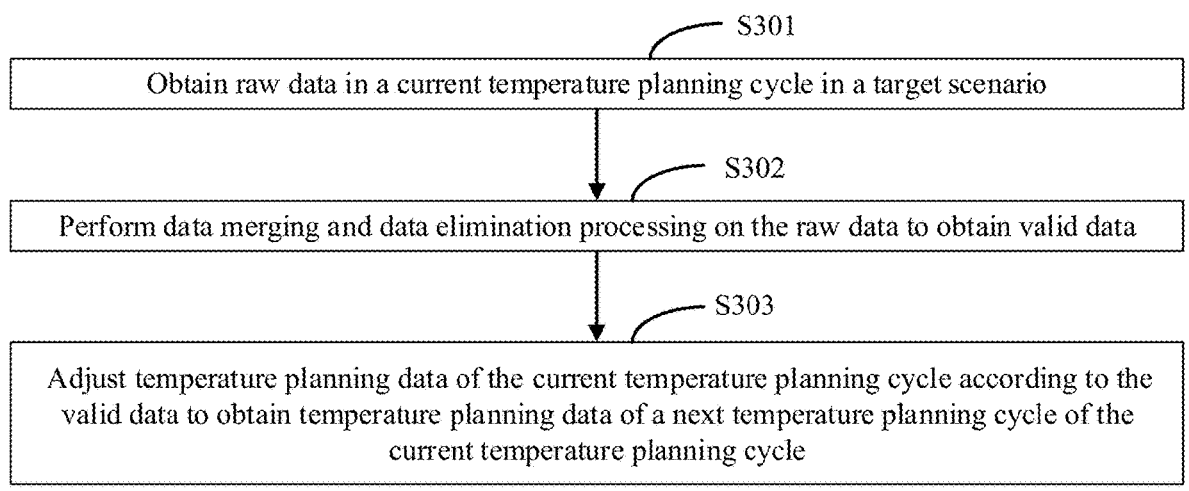
FIG. 2 is a schematic flowchart of a scenario temperature planning method provided in an embodiment of the present application.

First, referring to FIG. 2, FIG. 2 is a schematic flowchart of a scenario temperature planning method provided in an embodiment of the present application. The method can be applied to the foregoing cloud device 100 or the foregoing temperature device 201. As shown in FIG. 2, the method includes the following steps.

S301: Obtain original data in a current temperature planning cycle in a target scenario.

Herein, the target scenario refers to any scenario that requires temperature planning and adjustment, and may be, for example, the foregoing office scenario, family scenario, and the like. The temperature planning cycle refers to a time cycle which is obtained by dividing a time based on a scenario rule of the target scenario and matches a scenario operation rule. The temperature planning cycle may be used to reflect time variation characteristics of one or more scenario operation rules of the target scenario. The scenario operation rules of the target scenario include, but are not limited to, a temperature usage rule, a personnel working rule, a machine operation rule, a personnel flow rule and other contents that have a regular influence on the temperature in the target scenario. For example, if the target scenario is the family scenario, one day may be used as a temperature planning cycle based on work and rest rules of people in the family scenario, or one week may be used as a temperature planning cycle based on rules of people's going out to work in the family scenario. For another example, if the target scenario is a shopping mall scenario, one month may be used as one temperature planning cycle based on management and scheduling rules of a shopping mall. For still another example, if the target scenario is the machine room scenario, one day may be used as one temperature planning cycle based on operation rules of machines in the machine room scenario, which is not limited to the description herein. The current temperature planning cycle refers to a temperature planning cycle currently being experienced in the target scenario.

The original data in the current temperature planning cycle is data generated based on the user's temperature adjustment operation in the current temperature planning cycle. If the user performs a temperature adjustment operation once in the current temperature planning cycle, one piece of original data will be generated. If the user performs temperature adjustment operations for a plurality of times in the current temperature planning cycle, a plurality of pieces of original data will be generated, and will be arranged based on the sequence of the temperature adjustment operations. One piece of original data may include a temperature adjustment time and a temperature value, where the temperature adjustment time refers to a time point when a temperature adjustment operation occurs, and the temperature value refers to a temperature value set by the temperature adjustment operation. Optionally, one piece of original data may further include a temperature adjustment value and/or temperature duration. The temperature adjustment value refers to a difference between a temperature value before a temperature adjustment and a temperature value after the temperature adjustment, that is, a difference between a temperature value before a temperature adjustment operation and a temperature value after the temperature adjustment operation. The temperature duration refers to duration of time during which a temperature setting is always maintained at a temperature value set by the temperature adjustment operation, that is, a time length between a temperature adjustment time corresponding to the current temperature adjustment operation and a temperature adjustment time corresponding to a latest temperature adjustment operation after the current temperature adjustment operation. The latest temperature adjustment operation after the temperature adjustment operation may refer to the user's temperature adjustment operation or a temperature adjustment operation performed based on preset temperature planning data. For example, the user performed a first temperature adjustment operation at 12:00 on Jul. 10, 2021 to adjust the temperature from 25° C. to 26° C., and then performed a second temperature adjustment operation at 13:00 on Jul. 10, 2021 to adjust the temperature from 26° C. to 21° C.; and then, the user performed a temperature adjustment operation again at 13:25 on Jul. 10, 2021 based on the preset temperature planning data to adjust the temperature from 21° C. to 25° C. Then the original data corresponding to the first temperature adjustment operation includes 2021.7.10 12:00 (temperature adjustment time), 26° C. (temperature value), 1° C. (temperature adjustment value), 1 hour (temperature duration), and original data corresponding to the second temperature adjustment operation includes 2021.7.10 13:00 (temperature adjustment time), 21° C. (temperature value), 5° C. (temperature adjustment value), and 25 minutes (temperature duration).

Specifically, when this method is applied to the foregoing cloud device 100, the cloud device 100 can obtain original data in the current temperature planning cycle in the target scenario by obtaining original data reported by the temperature adjustment device 200 based on the user's temperature adjustment operation. When this method is directly applied to the temperature adjustment device 200, each time the user performs a temperature adjustment operation, the temperature adjustment device 200 records a time of the temperature adjustment operation and a temperature value set by the temperature adjustment operation, so as to obtain the original data in the current temperature planning cycle in the target scenario.

S302: Perform data merging and data elimination processing on the original data to obtain valid data.

In this embodiment of the present application, performing data merging and data elimination processing on the original data refers to filtering original data matching the user's temperature adjustment operation to obtain data that reasonably reflects the user's temperature adjustment rule in the current temperature planning cycle. Temperature duration corresponding to the valid data is greater than first preset duration. The first preset duration may be set based on an actual demand in the target scenario, and is used to measure rationality of the temperature adjustment operation in the target scenario. If the temperature duration corresponding to the temperature adjustment operation is greater than the first preset duration, it indicates that the temperature adjustment operation is reasonable. If the temperature duration corresponding to the temperature adjustment operation is less than or equal to the first preset duration, it indicates that the temperature adjustment operation is excessively frequent and unreasonable. Specifically, the first preset duration may be, for example, half an hour or 40 minutes.

In a possible implementation, data merging and data elimination processing may be performed on the original data by using the following method to obtain valid data: if it is determined that duration between a temperature adjustment time of first original data and a temperature adjustment time of second original data is less than second preset duration, and temperature adjustment values corresponding to the first original data and the second original data are both less than a first preset value, merging the first original data and the second original data; and then deleting third original data from the merged original data, where temperature duration corresponding to the third original data is less than or equal to the first preset duration.

Herein, the first original data is any piece of original data, and the second original data is a next piece of original data of the first original data. The second preset duration may be a preset minimum time granularity of temperature adjustment, that is, preset minimum duration between two temperature adjustment operations, which is used to ensure the rationality of the temperature adjustment. For example, the second preset duration may be 60 minutes. The first preset value is used to measure a magnitude of temperature adjustment. For example, the first preset value may be 6° F. If duration between a temperature adjustment time of first original data and a temperature adjustment time of second original data is less than second preset duration, and temperature adjustment values corresponding to the first original data and the second original data are both less than a first preset value, it indicates that an interval between two temperature adjustments is shorter and an adjustment amplitude is smaller. The first original data and the second original data are merged to obtain a piece of merged original data, and two temperature adjustments with a smaller adjustment amplitude are converted into one temperature adjustment, to make the temperature adjustment data more reasonable and effective. After the original data with a shorter interval and a smaller adjustment amplitude is merged, the third original data with shorter temperature duration is deleted, so that some invalid temperature adjustment data can be filtered out, thereby further ensuring the validity of the temperature adjustment data.

Optionally, if the duration between the temperature adjustment time of the first original data and the temperature adjustment time of the second original data is not less than the second preset duration, or the temperature adjustment value corresponding to the first original data is not less than the first preset value, or the temperature adjustment value corresponding to the second original data is not less than the first preset value, then the first original data and the second original data are not merged. These several cases indicate that both the first original data and the second original data are valid temperature adjustment data, which can reflect the user's temperature adjustment requirement.

In a specific implementation, the temperature adjustment time of the first original data may be used as a temperature adjustment time of the merged original data, and a temperature value of the second original data may be used as a temperature value of the merged original data, so that the first original data and the second original data are merged to obtain the merged original data. The temperature duration of the merged original data is equal to the sum of the temperature duration of the first original data and the temperature duration of the second original data. The temperature adjustment time of the former piece of original data is used as the temperature adjustment time of the merged original data, and the temperature value of the latter piece of original data is used as the temperature value of the merged original data, so that the original data with a shorter time interval can be merged, and the temperature adjustment data is enabled to match the user's latest temperature adjustment operation, so as to make the temperature adjustment data more reasonable. Optionally, the temperature adjustment time of the first original data may alternatively be used as a temperature adjustment time of the merged original data, a temperature value of the first original data may alternatively be used as a temperature value of the merged original data, so that the first original data and the second original data are merged to obtain the merged original data. This can filter out temperature adjustment data generated by a user misoperation.

Optionally, before the first original data and the second original data are merged, it may be further judged whether the sum of the temperature duration corresponding to the first original data and the temperature duration corresponding to the second original data is less than the third preset duration; and if the sum is greater than or equal to the third preset duration, no data is merged, or if the sum is less than the third preset duration, the first original data and the second original data are merged. The third preset duration is greater than the second preset duration. The third preset duration may be a preset maximum time granularity of temperature adjustment, that is, preset maximum duration between two temperature adjustment operations, which is used to ensure the rationality of the temperature adjustment. For example, the second preset duration may be 2 hours. The two pieces of original data are merged only when the sum of the temperature duration of the former and latter pieces of original data is not greater than the third preset duration, which can prevent a situation that the temperature adjustment data does not change for a long time, ensuring rationality of the temperature adjustment data.

S303: Adjust temperature planning data of the current temperature planning cycle based on the valid data to obtain temperature planning data of a next temperature planning cycle of the current temperature planning cycle.

Herein, the temperature planning data of the current temperature planning cycle is temperature data pre-planned to adjust the temperature of the target scenario in the current planning cycle. The temperature planning data in the current planning cycle may include time points of temperature adjustment in the current planning cycle and a temperature adjustment content (such as a temperature adjustment value, a temperature value, and temperature duration) corresponding to each temperature adjustment time point. Based on the time points of temperature adjustment in the current planning cycle and the temperature adjustment content corresponding to each temperature adjustment time, the current planning cycle may be divided into a plurality of time periods with different temperature values and different temperature duration, and each time period corresponds to one specific temperature value and temperature duration.

Specifically, if a historical temperature planning cycle exists before the current temperature planning cycle, the temperature planning data of the current planning cycle is obtained by adjusting temperature planning data of a previous temperature planning cycle of the current planning cycle. If no historical temperature planning cycle exists before the current planning cycle, the temperature planning data of the current planning cycle may be preset temperature planning data. The preset temperature planning data may be temperature planning data determined based on big data collection, which reflects a temperature adjustment habit/rule of most users in the target scenario.

Figure 3A:
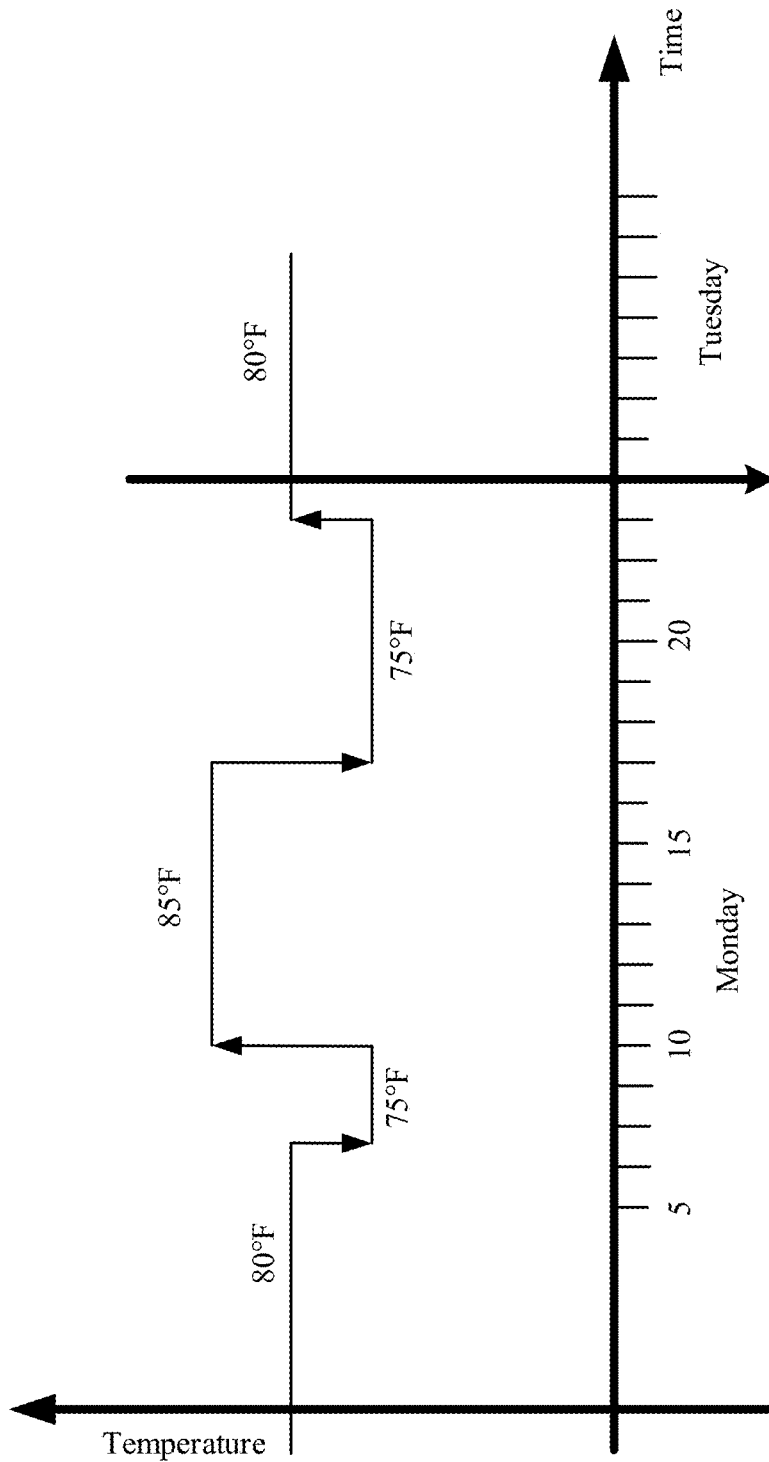
FIG. 3A is a schematic diagram of a type of temperature planning data provided in an embodiment of the present application.

For example, in the family scenario, average user's daily temperature adjustment habits are: 6:30-10:00, the temperature is set to 75° F.; 10:00-18:00, the temperature is set to 85° F.; 18:00-23:00, the temperature is set to 75° F.; and 23:00-6:30, the temperature is set to 80° F. Then the preset temperature planning data may be as shown in FIG. 3A.

In this embodiment of the present application, the temperature planning data of the current temperature planning cycle is adjusted based on the valid data, so that temperature planning data of a next temperature planning cycle of the current temperature planning cycle can be obtained, and the temperature planning data of the next temperature planning cycle may be used to adjust the temperature of the target scenario in the next temperature planning cycle.

For example, if one day is used as a temperature planning cycle, temperature planning data of the former of two adjacent days may be adjusted to obtain temperature planning data of the latter of the two adjacent days. For another example, if one week is used as a temperature planning cycle, temperature planning data of the former of two adjacent weeks may be adjusted to obtain temperature planning data of the latter of the two adjacent weeks, that is, temperature planning data of Monday of the previous week is adjusted to obtain temperature planning data of Monday of the next week, temperature planning data of Tuesday of the previous week is adjusted to obtain temperature planning data of Tuesday of the next week, temperature planning data of Wednesday of the previous week is adjusted to obtain temperature planning data of Wednesday of the next week, and so on.

In a feasible implementation, the temperature planning data of the current temperature planning cycle can be adjusted by using the following method: determining a temperature adjustment time, a temperature value and temperature duration corresponding to the valid data; and adjusting, in the temperature planning data of the current temperature planning cycle, a temperature value of a target time period to the temperature value corresponding to the valid data to obtain temperature planning data of the target time period, where the target time period uses the temperature adjustment time corresponding to the valid data as a start time, and uses the temperature duration corresponding to the valid data as duration.

For example, if one week is used as a temperature planning cycle, a temperature adjustment time corresponding to valid data is 6:00 on Monday, a temperature value is 78° F., and temperature duration is 3 hours, then the temperature value of the time period 6:00-9:00 on Monday may be adjusted to 78° F. in the current temperature planning cycle.

Optionally, after the temperature value of the target time period is adjusted to the temperature value corresponding to the valid data, based on the temperature adjustment time and the temperature duration corresponding to the target time period, in the temperature planning data of the current temperature planning cycle, the start time of the target time period may be further advanced, and/or an end time of the target time period may be further delayed, so that the temperature planning data of the adjusted target time period conforms to a preset granularity rule; and in the temperature planning data of the adjusted current temperature planning cycle, temperature planning data of a first time period and temperature planning data of a second time period are merged, where the first time period and the second time period are two adjacent time periods with different temperature planning data, and the second time period is a next time period of the first time period; where a temperature difference between the temperature planning data of the first time period and the temperature planning data of the second time period is less than a second preset value, and/or duration of the second time period is less than fourth preset duration. For the method for merging temperature planning data, reference may be made to the foregoing method for merging original data. Details are not described herein.

Making the adjusted temperature planning data conform to the preset granularity rule means that the temperature adjustment time corresponding to the adjusted temperature planning data is at a preset temperature adjustment moment, that is, the adjusted temperature planning data conforms to the preset adjustment rule such as a rule of adjustment at an integer-hour time (that is, the temperature may be adjusted at every integer-hour time), a rule of adjustment at an integer-quarter time (that is, the temperature may be adjusted at every integer-quarter time) or a rule of adjustment at an integer-ten-minute time (that is, the temperature may be adjusted at every integer-ten-minute time). Advancing the start time of the time period corresponding to the valid data, and/or delaying the end time of the time period corresponding to the valid data can make the adjusted temperature planning data conform to the preset granularity rule, and make the temperature planning data more regular.

Specifically, after the start time and the end time of the target time period are adjusted, temperature planning data with shortest duration can be obtained through traversal. If the duration of the temperature planning data with the shortest duration is less than the fourth preset duration, it indicates that the temperature planning data does not confirm to the minimum time granularity of temperature adjustment. Merging the temperature planning data with the previous piece of temperature planning data can make the temperature planning data meet the minimum time granularity of temperature adjustment. For example, the fourth preset duration may be 60 minutes. Optionally, after the start time and the end time of the target time period are adjusted, if a temperature difference between two pieces of adjacent temperature planning data (that is, the temperature value of the former piece of temperature planning data and the temperature value of the latter piece of temperature planning data) is less than the second preset value, it indicates that the two pieces of temperature planning data are close, and the rationality of the temperature planning data can be further ensured by merging temperature planning data with a temperature difference less than the second preset value. For example, the second preset value may be 4° F.

In the technical solution of FIG. 2, the original data generated based on the user's temperature adjustment operation in the current temperature planning cycle in the target scenario is obtained first, so that data that can reflect the user's real temperature requirement can be obtained; then data merging and data elimination processing is performed on the original data, so that the valid data that can reflect the user's real temperature requirement and is reasonable and effective can be obtained; finally, the temperature planning data of the current temperature planning cycle is adjusted based on the valid data to obtain the temperature planning data of the next temperature planning cycle of the current temperature planning cycle, so that the temperature planning data may be reasonably and match the user's temperature requirement, and therefore in the next temperature planning cycle, when the temperature in the target scenario is adjusted based on the temperature planning data of the next temperature planning cycle, the adjusted temperature can meet the user's temperature requirement without requiring the user to manually plan and set the temperature, thereby improving user experience.

In some possible embodiments, when multi-cycle characteristics exist in a target scenario, a cycle may be divided based on a large-cycle characteristic in the scenario to obtain a scenario planning cycle, and then one scenario planning cycle is divided into a plurality of temperature planning cycles based on a small-cycle characteristic in the scenario planning cycle, so as to divide the target scenario into a plurality of temperature planning cycles. Cycle characteristics refer to that certain behaviors or time points are recurring regularly. The large-cycle characteristic refers to a long cyclic time interval, while the small-cycle characteristic refers to a short cyclic time interval. Based on the rules of people's going out to work in the family scenario, one week is used as one scenario planning cycle. In the scenario planning cycle, the time is from 00:00 to 24:00 every day, and the scenario planning cycle may be subdivided, to use one day as a temperature planning cycle.

In some possible implementations, if two pieces of original data with temperature adjustment values less than a third preset value are obtained in the same time period of two consecutive temperature planning cycles, adjusting temperature planning data of each temperature planning cycle based on the two pieces of original data with the temperature adjustment values less than the third preset value.

Herein, two consecutive temperature planning cycles refer to two adjacent temperature planning cycles. For example, if one week is used as a scenario planning cycle and one day is used as a temperature planning cycle, then Monday and Tuesday are two consecutive temperature planning cycles, Tuesday and Wednesday are two consecutive temperature planning cycles, and so on. The third preset value is used to measure a magnitude of temperature adjustment. If the temperature adjustment value is less than the third preset value, it indicates that the magnitude of temperature adjustment is smaller. For example, the third preset value may be 6° F. If original data with a temperature adjustment value less than the third preset value is obtained in only one temperature planning cycle, it indicates that a temperature adjustment operation corresponding to the original data is an occasional operation in one scenario planning cycle and has no reference value. If two pieces of original data with temperature adjustment values less than the third preset value are obtained in the same time period of two consecutive temperature planning cycles, it indicates that temperature adjustment operations corresponding to the two pieces of original data are not occasional operations, but are the user's normal operations in one scenario planning cycle. Temperature planning data of each temperature planning cycle is adjusted based on the two pieces of original data with the temperature adjustment values less than the third preset value, so that the adjusted temperature planning data can meet the user's temperature requirement.

In a specific implementation, based on two pieces of original data with a temperature adjustment value less than the third preset value, in each temperature planning cycle, a temperature value in the same time period as the time period corresponding to the two pieces of original data with the adjustment value less than the third preset value may be adjusted to the temperature value corresponding to the two pieces of original data with the adjustment value less than the third preset value. For example, with one week used as a scenario planning cycle, if original data with a temperature value of 88° F. and a temperature adjustment value of 5° F. is obtained at 9:00-10:00 on Monday and 9:00-10:00 on Tuesday, the temperature adjustment by 5° F. is performed at 9:00-10:00 every day of the week, and the temperature value is adjusted to 88° F. to obtain daily temperature planning data.

In some possible cases, a plurality of temperature planning cycles in a scenario planning cycle may further fall into a plurality of types based on user behavior information in a target scenario, and if two pieces of original data with temperature adjustment values less than the third preset value are obtained in the same time period of two consecutive temperature planning cycles of the same type, temperature planning data of each temperature planning cycle which is of the same type as the two consecutive temperature planning cycles of the same type is adjusted based on the two pieces of original data with the temperature adjustment values less than the third preset value. Temperature planning based on different types can make temperature planning data more refined and humanized.

For example, based on a situation of the user's going out to work in a family scenario, one week is used as a scenario planning cycle, Monday to Friday in the scenario planning cycle fall into working days, and Saturday and Sunday in the scenario planning cycle fall into rest days. If original data with a temperature value of 88° F. and a temperature adjustment value of 5° F. is obtained at 9:00-10:00 on Monday and 9:00-10:00 on Tuesday, the temperature adjustment by 5° F. is performed at 9:00-10:00 on each of the working days, and the temperature value is adjusted to 88° F. to obtain temperature planning data of the working days. Similarly, if original data with a temperature value of 86° F. and a temperature adjustment value of 3° F. is obtained at 13:00-14:00 on Monday and 9:00-10:00 on Tuesday, the temperature adjustment by 3° F. is performed at 13:00-14:00 on each of the rest days, and the temperature value is adjusted to 86° F. to obtain temperature planning data of the rest days.

Optionally, in some other possible scenarios, if two pieces of original data with temperature adjustment values less than a fourth preset value are obtained in the same time period of a first temperature planning cycle and a second temperature planning cycle, adjusting, based on the two pieces of original data with the temperature adjustment values less than the fourth preset value, temperature planning data of a temperature planning cycle corresponding to the first temperature planning cycle in each scenario planning cycle, where the first temperature planning cycle and the second temperature planning cycle are separately the same temperature planning cycle in two adjacent scenario planning cycles.

Herein, similar to the third preset value, the fourth preset value is used to measure a magnitude of temperature adjustment. If the temperature adjustment value is less than the fourth preset value, it indicates that the magnitude of temperature adjustment is smaller. For example, the fourth preset value may be 6° F. If original data with a temperature adjustment value less than the fourth preset value is obtained in only one temperature planning cycle, it indicates that a temperature adjustment operation corresponding to the original data is only an occasional operation and has no reference value. If two pieces of original data with temperature adjustment values less than the fourth preset value are obtained in the same time period of two consecutive temperature planning cycles, it indicates that temperature adjustment operations corresponding to the original data are normal operations. In each scenario planning cycle, temperature planning data of the temperature planning cycle corresponding to the first temperature planning cycle is adjusted based on the two pieces of original data with the temperature adjustment values less than the fourth preset value, so that the adjusted temperature planning data can meet the user's temperature requirement.

Specifically, based on two pieces of original data with a temperature adjustment value less than the fourth preset value, in each temperature planning cycle, a temperature value in the same time period in the same temperature planning cycle as the two pieces of original data with temperature adjustment values less than the fourth preset value may be adjusted to the temperature value corresponding to the two pieces of original data with the adjustment value less than the fourth preset value. For example, with one week used as a temperature planning cycle, if original data with a temperature value of 80° F. and a temperature adjustment value of 5° F. is obtained at 9:00-10:00 on Monday of the first week and 9:00-10:00 on Monday of the second week, the temperature adjustment by 5° F. is performed at 9:00-10:00 on Monday of each week, and the temperature value is adjusted to 80° F. to obtain temperature planning data of Every Monday.

To facilitate the understanding of the technical solutions of the present application, the foregoing solutions are explained below with reference to specific examples, using a scenario planning cycle being one week as an example.

Figure 3B:
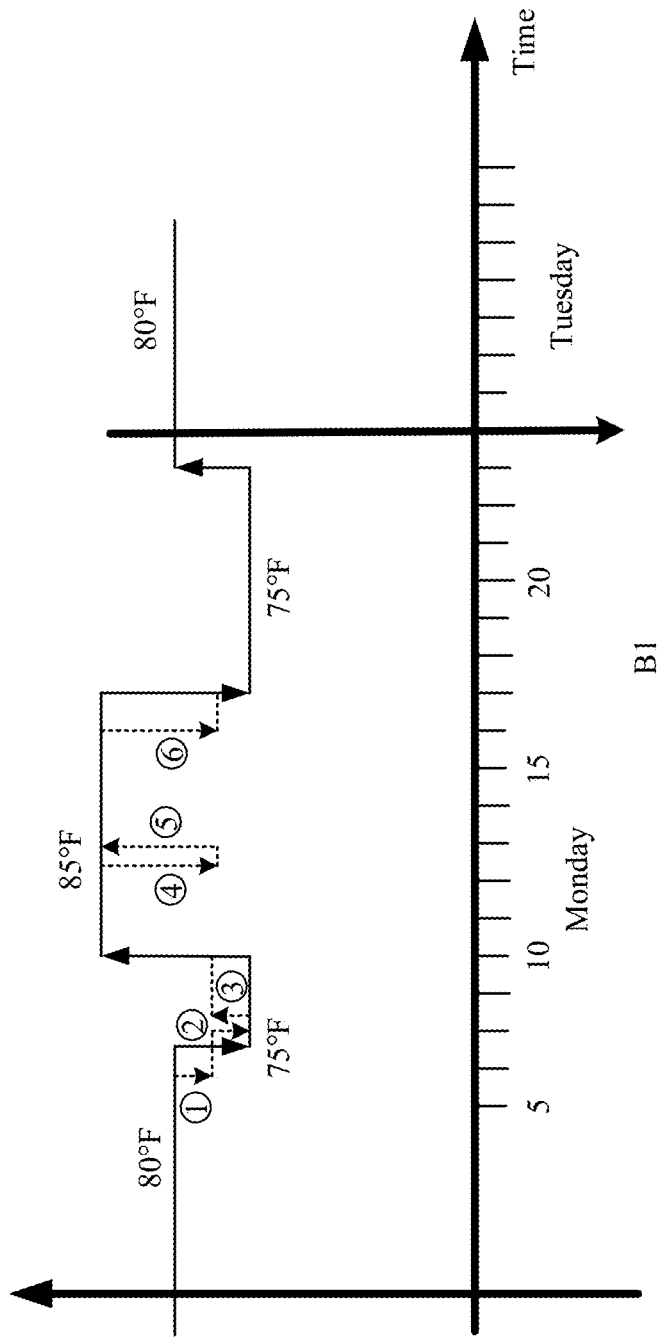
FIG. 3B to FIG. 3D are a schematic diagram of another type of temperature planning data provided in an embodiment of the present application.
Figure 3C:
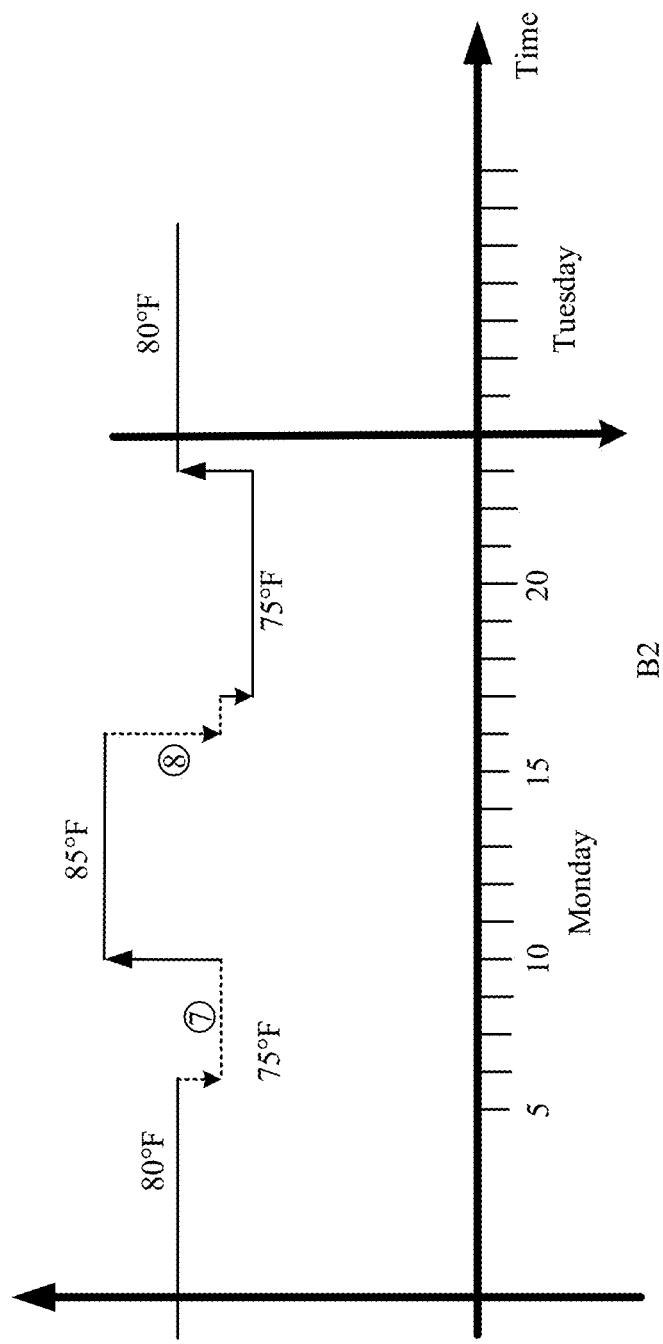
Figure 3D:
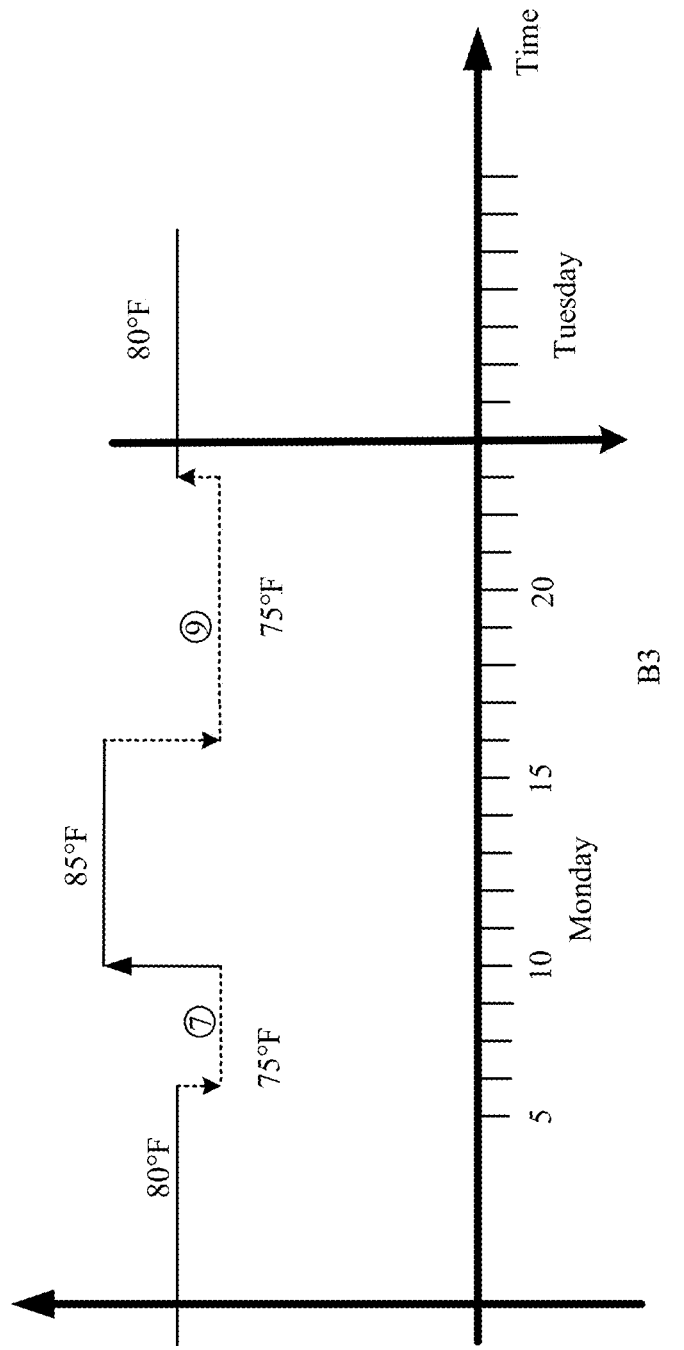

Referring to FIG. 3B to FIG. 3D, a solid line part in FIG. 3B to FIG. 3D is temperature planning data of the current planning cycle, and a dashed arrow in FIG. 3B is a temperature adjustment operation performed by the user. A time corresponding to the dashed arrow is a temperature adjustment time, and a length of the dashed arrow is a temperature adjustment time. An initial position of the dashed arrow is a temperature value before the temperature adjustment operation occurs, and an end position of the dashed arrow is a temperature value after the temperature adjustment operation occurs, that is, the temperature value contained in the original data. A dashed line segment after the dashed arrow denotes temperature duration. It may be learned from FIG. 3B that the user has performed temperature adjustment operations for six times. Because the three operations ①, ② and ③ have a short interval, within 60 minutes, ①, ② and ③ are merged, a time of the operation ① is a temperature adjustment time, and a temperature value of the operation ③ is used as a temperature value for merging, to obtain temperature planning data ⑦ of FIG. 3C; an interval between the two operations ④ and ⑤ is less than 40 minutes, and the operation is deemed invalid and original data with the shorter temperature duration is deleted from the original data. Temperature duration of the operation ⑥ is 40 minutes, and is determined as being valid. The temperature start time of ⑥ is advanced to obtain temperature planning data of FIG. 3C, and it is ensured that the temperature duration of the temperature planning data ⑧ is 60 minutes. Because the temperature difference between the temperature planning data ⑧ of FIG. 3C and the next piece of temperature planning data is within 4° F., the two pieces of temperature planning data are merged, and the temperature of the temperature planning data ⑧ is used as the temperature value of the merged temperature planning data to obtain temperature planning data ⑨ of FIG. 3D, so as to obtain temperature planning data of the next planning cycle, that is, temperature planning data shown in the FIG. 3D.

Figure 3E:
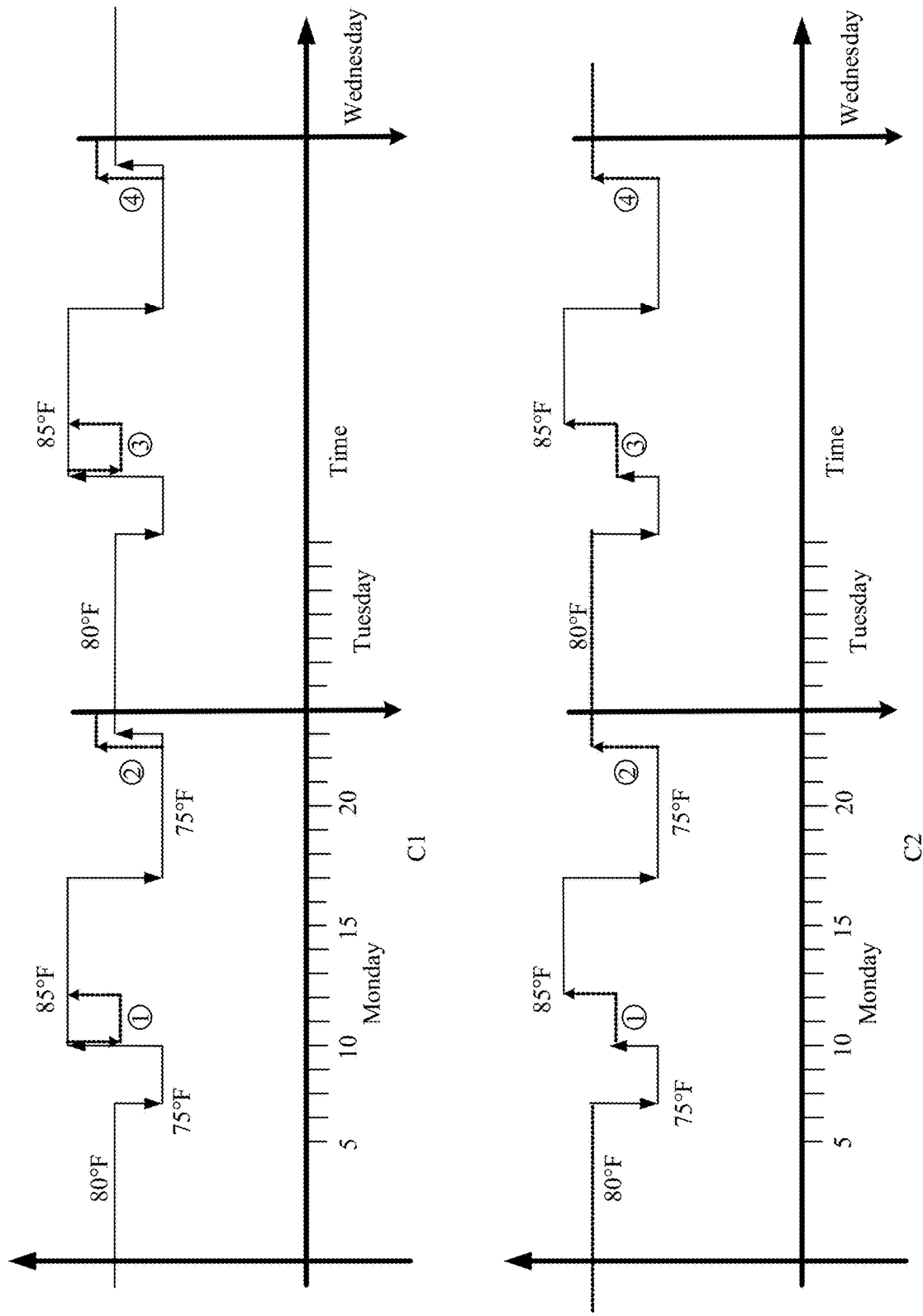
FIG. 3E is a schematic diagram of still another type of temperature planning data provided in an embodiment of the present application.

Referring to FIG. 3E, a solid line part in FIG. 3E is temperature planning data of the current planning cycle, and a dashed arrow in a C1 part is a temperature adjustment operation performed by the user. A time corresponding to the dashed arrow is a temperature adjustment time, and a length of the dashed arrow is a temperature adjustment time. An initial position of the dashed arrow is a temperature value before the temperature adjustment operation occurs, and an end position of the dashed arrow is a temperature value after the temperature adjustment operation occurs, that is, the temperature value contained in the original data. A dashed line segment after the dashed arrow denotes temperature duration. It can be learned from the C1 part that an operation 1 (① and ③)) and an operation 2 (② and ④)) are performed in the same time period for two consecutive days. It is judged that the operation 1 and the operation 2 are valid, and daily temperature planning data is adjusted to obtain temperature planning data of a C2 part.

The method of the present application is described above. To better implement the method of the present application, an apparatus according to the present application is described below.

Figure 4:
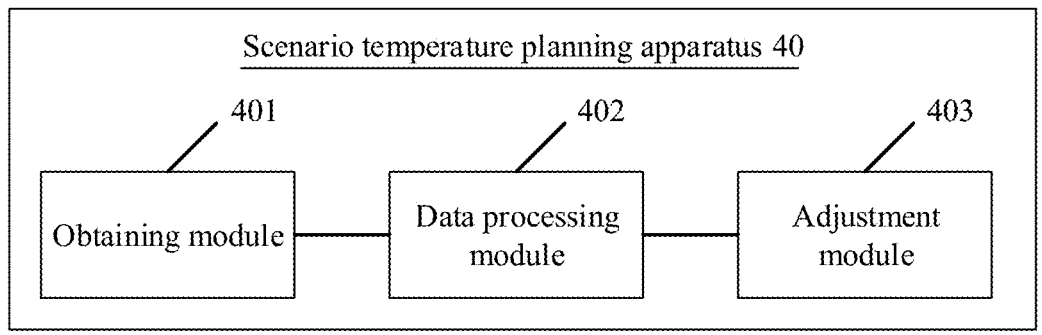
FIG. 4 is a schematic structural diagram of a scenario temperature planning apparatus provided in an embodiment of the present application.

Referring to FIG. 4, FIG. 4 is a schematic structural diagram of a scenario temperature planning apparatus provided in an embodiment of the present application. As shown in FIG. 4, the apparatus 40 includes:

an obtaining module 401, configured to obtain original data in a current temperature planning cycle in a target scenario, where the foregoing original data is data generated based on a user's temperature adjustment operation, and the foregoing original data includes a temperature adjustment time and a temperature value;

a data processing module 402, configured to is perform data merging and data elimination processing on the foregoing original data to obtain valid data, where temperature duration corresponding to the foregoing valid data is greater than first preset duration, temperature duration corresponding to any data refers to a time length of a temperature keeping time period corresponding to the foregoing any data, the foregoing temperature keeping time period uses the temperature adjustment time of the foregoing any data as a start time and uses a next temperature adjustment time corresponding to the foregoing any data as an end time, and the foregoing next temperature adjustment time refers to a latest temperature adjustment time after the temperature adjustment time of the foregoing any data; and an adjustment module 403, configured to adjust temperature planning data of the foregoing current temperature planning cycle based on the foregoing valid data to obtain temperature planning data of a next temperature planning cycle of the foregoing current temperature planning cycle, so as to adjust a temperature in a target scenario in the foregoing next temperature planning cycle.

In a possible design, the foregoing data processing module 402 is specifically configured to: if it is determined that duration between a temperature adjustment time of first original data and a temperature adjustment time of second original data is less than second preset duration, and temperature adjustment values corresponding to the foregoing first original data and the foregoing second original data are both less than a first preset value, merge the foregoing first original data and the foregoing second original data, where the foregoing first original data is any original data, the foregoing second original data is next original data of the foregoing first original data, and the foregoing temperature adjustment values each refer to a difference between a temperature value before a temperature adjustment and a temperature value after the temperature adjustment; and eliminate third original data from the merged original data, where temperature duration corresponding to the foregoing third original data is less than or equal to the foregoing first preset duration.

In a possible design, the foregoing data processing module 402 is specifically configured to: use the temperature adjustment time of the foregoing first original data as a temperature adjustment time of the merged original data, use a temperature value of the foregoing second original data as a temperature value of the foregoing merged original data, and use a sum of temperature duration corresponding to the foregoing first original data and the foregoing second original data as temperature duration corresponding to the merged original data.

In a possible design, the foregoing data processing module 402 is specifically configured to: if the sum of the temperature duration corresponding to the foregoing first original data and the temperature duration corresponding to the foregoing second original data is less than third preset duration, merge the foregoing first original data and the foregoing second original data, where the foregoing third preset duration is greater than the foregoing second preset duration.

In a possible design, the foregoing adjustment module 403 is specifically configured to: determine a temperature adjustment time, a temperature value and temperature duration corresponding to the foregoing valid data; and adjust, in the temperature planning data of the foregoing current temperature planning cycle, a temperature value of a target time period to the temperature value corresponding to the foregoing valid data to obtain temperature planning data of the foregoing target time period, where the foregoing target time period uses the temperature adjustment time corresponding to the foregoing valid data as a start time, and uses the temperature duration corresponding to the foregoing valid data as duration.

In a possible design, the foregoing adjustment module 403 is further configured to: based on the temperature adjustment time and the temperature duration corresponding to the foregoing target time period, in the temperature planning data of the foregoing current temperature planning cycle, advance the start time of the foregoing target time period, and/or delay an end time of the foregoing target time period, so that the temperature planning data of the adjusted target time period conforms to a preset granularity rule, where the preset granularity rule refers to adjusting a temperature at a preset temperature adjustment moment; and in the temperature planning data of the adjusted current temperature planning cycle, merge temperature planning data of a first time period and temperature planning data of a second time period, where the foregoing first time period and the foregoing second time period are two adjacent time periods with different temperature planning data, and the foregoing second time period is a next time period of the foregoing first time period; where a temperature difference between the temperature planning data of the foregoing first time period and the temperature planning data of the second time period is less than a second preset value, and/or duration of the foregoing second time period is less than fourth preset duration, and the foregoing temperature adjustment value refers to a difference between a temperature value before a temperature adjustment and a temperature value after the temperature adjustment.

In a possible design, the foregoing adjustment module 403 is further configured to: if two pieces of original data with temperature adjustment values less than a third preset value are obtained in the same time period of two consecutive temperature planning cycles, adjust temperature planning data of each temperature planning cycle based on the two pieces of original data with the foregoing temperature adjustment values less than the third preset value, where the foregoing temperature adjustment value each refer to a difference between a temperature value before a temperature adjustment and a temperature value after the temperature adjustment.

In a possible design, a plurality of temperature planning cycles constitute a scenario planning cycle, and the foregoing scenario planning cycle is obtained based on cycle characteristics in the foregoing target scenario; and the foregoing adjustment module 403 is further configured to: if two pieces of original data with temperature adjustment values less than a fourth preset value are obtained in the same time period of a first temperature planning cycle and a second temperature planning cycle, adjust, based on the two pieces of original data with the foregoing temperature adjustment values less than the fourth preset value, temperature planning data of a temperature planning cycle corresponding to the foregoing first temperature planning cycle in each scenario planning cycle, where the foregoing first temperature planning cycle and the foregoing second temperature planning cycle are separately the same temperature planning cycle in two adjacent scenario planning cycles.

It should be noted that, for the content not mentioned in the embodiment corresponding to FIG. 4, reference may be made to the description of the method embodiments corresponding to FIG. 2 to FIG. 3E. Details are not described herein.

In the foregoing apparatus, the original data generated based on the user's temperature adjustment operation in the current temperature planning cycle in the target scenario is obtained first, so that data that can reflect the user's real temperature requirement can be obtained; then data merging and data elimination processing is performed on the original data, so that the valid data that can reflect the user's real temperature requirement and is reasonable and effective can be obtained; finally, the temperature planning data of the current temperature planning cycle is adjusted based on the valid data to obtain the temperature planning data of the next temperature planning cycle of the current temperature planning cycle, so that the temperature planning data may be reasonably and match the user's temperature requirement, and therefore in the next temperature planning cycle, when the temperature in the target scenario is adjusted based on the temperature planning data of the next temperature planning cycle, the adjusted temperature can meet the user's temperature requirement without requiring the user to manually plan and set the temperature, thereby improving user experience.

Figure 5:
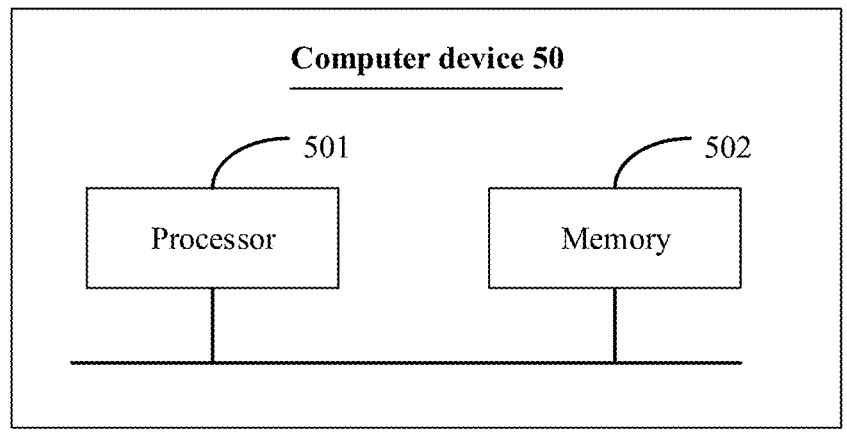
FIG. 5 is a schematic structural diagram of a computer device provided in an embodiment of the present application.

Referring to FIG. 5, FIG. 5 is a schematic structural diagram of a computer device provided in an embodiment of the present application. The computer device 50 includes a processor 501 and a memory 502. The processor 501 is connected to the memory 502. For example, the processor 501 may be connected to the memory 502 by using a bus.

The processor 501 is configured to support the computer device 50 to perform corresponding functions in the methods of the foregoing method embodiments. The processor 501 may be a central processing unit (CPU), a network processor (NP), a hardware chip or an arbitrary combination thereof. The foregoing hardware chip may be an application specific integrated circuit (ASIC), a programmable logic device (PLD) or a combination thereof. The foregoing PLD may be a complex programmable logic device (CPLD), a field-programmable gate array (FPGA), generic array logic (GAL) or an arbitrary combination thereof.

The memory 502 is configured to store program code and the like. The memory 502 may include a volatile memory (VM), such as a random access memory (RAM); the memory 502 may also include a non-volatile memory (NVM), such as a read-only memory (ROM), a flash memory, a hard disk drive (HDD) or a solid-state drive (SSD); or the memory 502 may include a combination of the foregoing types of memories.

The processor 501 may invoke the program code to perform the following operations:

obtaining original data in a current temperature planning cycle in a target scenario, where the foregoing original data is data generated based on a user's temperature adjustment operation, and the foregoing original data includes a temperature adjustment time and a temperature value;

performing data merging and data elimination processing on the foregoing original data to obtain valid data, where temperature duration corresponding to the foregoing valid data is greater than first preset duration, and temperature duration corresponding to any data refers to the time duration for which the temperature is kept at the temperature value of any of the foregoing data with the temperature adjustment time of any of the foregoing data as a start time; and adjusting temperature planning data of the foregoing current temperature planning cycle based on the foregoing valid data to obtain temperature planning data of a next temperature planning cycle of the foregoing current temperature planning cycle, so as to adjust a temperature in a target scenario in the foregoing next temperature planning cycle.

It should be noted that, for the implementation of each operation, reference may be correspondingly made to the corresponding description of the foregoing method embodiments. The processor 501 may also perform other operations in the foregoing method embodiments in conjunction with other functional hardware.

An embodiment of the present application further provides a computer-readable storage medium, where the computer-readable storage medium stores a computer program, the computer program includes program instructions, and when the program instructions are executed by a computer, the computer is enabled to perform the method according to the foregoing embodiment.

A person of ordinary skill in the art may understand that all or some processes in implementing the method of the foregoing embodiment may be completed by using a computer program to instruct related hardware. The program may be stored in a the computer-readable storage medium. The program, when executed, may include processes of the embodiment of each of the methods described above. The storage medium may be a magnetic disk, an optical disk, a read-only memory (ROM), a random access memory (RAM), or the like.

The above disclosed is only preferred embodiments of the present application and, certainly, cannot be used to limit the scope of the claims of the present application. Therefore, equivalent changes made according to the claims of the present application shall still fall within the scope of the present application.

What is claimed is:

1. A scenario temperature planning method, comprising:
    obtaining original data in a current temperature planning cycle in a target scenario, wherein the original data is data generated based on a user's temperature adjustment operation, and the original data comprises a temperature adjustment time and a temperature value;
    performing data merging and data elimination processing on the original data to obtain valid data, wherein temperature duration corresponding to the valid data is greater than first preset duration, temperature duration corresponding to any data refers to a time length of a temperature keeping time period corresponding to the any data, the temperature keeping time period uses the temperature adjustment time of the any data as a start time and uses a next temperature adjustment time corresponding to the any data as an end time, and the next temperature adjustment time refers to a latest temperature adjustment time after the temperature adjustment time of the any data; and
    adjusting temperature planning data of the current temperature planning cycle based on the valid data to obtain temperature planning data of a next temperature planning cycle of the current temperature planning cycle, so as to adjust a temperature in a target scenario in the next temperature planning cycle;
    wherein the performing data merging and data elimination processing on the original data comprises:
    if it is determined that duration between a temperature adjustment time of first original data and a temperature adjustment time of second original data is less than second preset duration, and temperature adjustment values corresponding to the first original data and the second original data are both less than a first preset value, merging the first original data and the second original data, wherein the first original data is any original data, the second original data is next original data of the first original data, and the temperature adjustment values each refer to a difference between a temperature value before a temperature adjustment and a temperature value after the temperature adjustment; and
    eliminating third original data from the merged original data, wherein temperature duration corresponding to the third original data is less than or equal to the first preset duration.

2. The method according to claim 1, wherein the merging the first original data and the second original data comprises:
    using the temperature adjustment time of the first original data as a temperature adjustment time of the merged original data, using a temperature value of the second original data as a temperature value of the merged original data, and using a sum of temperature duration corresponding to the first original data and the second original data as temperature duration corresponding to the merged original data.

3. The method according to claim 1, wherein the merging the first original data and the second original data comprises:
    if the sum of the temperature duration corresponding to the first original data and the temperature duration corresponding to the second original data is less than third preset duration, merging the first original data and the second original data, wherein the third preset duration is greater than the second preset duration.

4. The method according to claim 1, wherein the adjusting temperature planning data of the current temperature planning cycle based on the valid data to obtain temperature planning data of a next temperature planning cycle of the current temperature planning cycle comprises:
    determining a temperature adjustment time, a temperature value and temperature duration corresponding to the valid data; and
    adjusting, in the temperature planning data of the current temperature planning cycle, a temperature value of a target time period to the temperature value corresponding to the valid data to obtain temperature planning data of the target time period, wherein the target time period uses the temperature adjustment time corresponding to the valid data as a start time, and uses the temperature duration corresponding to the valid data as duration.

5. The method according to claim 4, wherein after the adjusting, in the temperature planning data of the current temperature planning cycle, a temperature value of a target time period to the temperature value corresponding to the valid data, the method further comprises:
    based on the temperature adjustment time and the temperature duration corresponding to the target time period, in the temperature planning data of the current temperature planning cycle, advancing the start time of the target time period, and/or delaying an end time of the target time period, so that the temperature planning data of the adjusted target time period conforms to a preset granularity rule, wherein the preset granularity rule refers to adjusting a temperature at a preset temperature adjustment moment; and in the temperature planning data of the adjusted current temperature planning cycle, merging temperature planning data of a first time period and temperature planning data of a second time period, wherein the first time period and the second time period are two adjacent time periods with different temperature planning data, and the second time period is a next time period of the first time period; wherein a temperature difference between the temperature planning data of the first time period and the temperature planning data of the second time period is less than a second preset value, and/or duration of the second time period is less than fourth preset duration, and the temperature adjustment value refers to a difference between a temperature value before a temperature adjustment and a temperature value after the temperature adjustment.

6. The method according to claim 1, further comprising:
if two pieces of original data with temperature adjustment values less than a third preset value are obtained in the same time period of two consecutive temperature planning cycles, adjusting temperature planning data of each temperature planning cycle based on the two pieces of original data with the temperature adjustment values less than the third preset value, wherein the temperature adjustment value each refer to a difference between a temperature value before a temperature adjustment and a temperature value after the temperature adjustment.

7. The method according to claim 1, wherein a plurality of temperature planning cycles constitutes a scenario planning cycle, and the scenario planning cycle is obtained based on cycle characteristics in the target scenario; and the method further comprises:
if two pieces of original data with temperature adjustment values less than a fourth preset value are obtained in the same time period of a first temperature planning cycle and a second temperature planning cycle, adjusting, based on the two pieces of original data with the temperature adjustment values less than the fourth preset value, temperature planning data of a temperature planning cycle corresponding to the first temperature planning cycle in each scenario planning cycle, wherein the first temperature planning cycle and the second temperature planning cycle are separately the same temperature planning cycle in two adjacent scenario planning cycles.

* * * * *